(12) United States Patent
Takehara et al.

(10) Patent No.: US 6,890,800 B2
(45) Date of Patent: May 10, 2005

(54) METHOD OF MANUFACTURING SEMICONDUCTOR DEVICE WITH CERAMIC MULTILAYER BOARD

(75) Inventors: Hideki Takehara, Kobe (JP); Noriyuki Yoshikawa, Ibaraki (JP); Susumu Tsumura, Akou (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 219 days.

(21) Appl. No.: 10/208,628

(22) Filed: Jul. 29, 2002

(65) Prior Publication Data

US 2003/0111725 A1 Jun. 19, 2003

(30) Foreign Application Priority Data

Dec. 14, 2001 (JP) .......................................... 2001-382214

(51) Int. Cl.[7] ................................................ H01L 21/44
(52) U.S. Cl. ........................................ 438/126; 438/110
(58) Field of Search ................................ 438/126, 127, 438/110, 125

(56) References Cited

U.S. PATENT DOCUMENTS

| 5,200,362 | A | | 4/1993 | Lin et al. | |
|---|---|---|---|---|---|
| 5,776,798 | A | | 7/1998 | Quan et al. | |
| 5,851,845 | A | * | 12/1998 | Wood et al. | ................... 438/15 |
| 6,308,938 | B1 | | 10/2001 | Futakuchi | |
| 6,326,701 | B1 | | 12/2001 | Shinogi et al. | |
| 6,624,058 | B1 | * | 9/2003 | Kazama | ..................... 438/612 |
| 2001/0023983 | A1 | | 9/2001 | Kobayashi et al. | |

FOREIGN PATENT DOCUMENTS

| CN | 1213173 | | 4/1999 | |
|---|---|---|---|---|
| JP | 10-92979 | | 4/1998 | |
| JP | 10-135377 | | 5/1998 | |
| JP | 11-265964 | | 9/1999 | |
| JP | 2001-217270 | | 8/2001 | |
| JP | 2001217270 | A * | 8/2001 | ........... H01L/21/56 |

* cited by examiner

*Primary Examiner*—Eddie Lee
*Assistant Examiner*—Douglas W. Owens
(74) *Attorney, Agent, or Firm*—Merchant & Gould P.C.

(57) ABSTRACT

One side of a ceramic multilayer board is attached to a resin film with adhesive, the resin film is mounted on a mold for resin sealing having a cavity provided in desired position, the position of the board is controlled by pressing against a portion of the resin film by a portion of the mold for sealing, and thereafter sealing is conducted by filling an epoxy resin into the cavity. The thus prepared semiconductor device has a rear face on which electrodes for connecting to outside are exposed, and the sealing resin is formed so as to be flush with respect to the rear face of the board, surround the periphery of the board, and form a cross section in a rectangular shape. With this configuration, the semiconductor device free from a crack can be sealed with resin.

8 Claims, 13 Drawing Sheets

METHOD OF MANUFACTURING SEMICONDUCTOR DEVICE WITH CERAMIC MULTILAYER BOARD

BACKGROUND OF THE INVENTION

1. Field of the Invention

The present invention relates to a semiconductor device including a ceramic multilayer board on which a semiconductor element and a peripheral circuit for the element are mounted and a method for manufacturing the same. More specifically, the present invention relates to a semiconductor device formed by sealing with a resin an array board including a plurality of matrix boards arranged thereon and a method for manufacturing the same.

2. Related Background Art

Recently, in order to cut down on costs and increase the common steps of assembly processes, a method including the steps of mounting a semiconductor element and peripheral circuit components such as a chip resistor, a chip capacitor, a chip inductor, on a ceramic multilayer board, sealing these elements with an epoxy resin, and thereafter breaking or dicing the board into individual pieces has become popular. In general, the epoxy resin is applied on the board by printing a liquid epoxy resin through a printing mask. Although this printing process is easy to conduct, the process has the following problems:

(1) variations in the thickness of resin in products are large, (2) since resin drips on the periphery of a resin printed portion, a discarded margin becomes necessary, (3) voids tend to be left in the resin, and (4) a gap between a chip component and a board cannot be filled.

The following describes an example of sealing a semiconductor device with resin according to the prior art, with reference to FIG. 9. In FIG. 9, a semiconductor element 1 is mounted on one side of a ceramic multilayer board 2, and chip components 3 including a chip resistor, a chip capacitor, and a chip inductor are mounted on the other side. The semiconductor element 1 is connected by a metal wire 4 to the chip components 3 and the like via another connecting means and through a through hole (not illustrated). The semiconductor element 1 is sealed with a potting resin 5, and the chip components also are sealed with an epoxy resin 6. The ceramic multilayer board 2 is a matrix board on a surface of which an electrode wiring pattern and a component mounting land for mounting a semiconductor element and chip components are arranged repeatedly lengthwise and breadthwise. The semiconductor element 1 is dice-bonded into a cavity 7 in the rear face of the ceramic multilayer board, is connected to an electrode wiring pattern formed within the cavity 7 by the metal wire 4, and is sealed with the potting resin 5. On the surface of the ceramic multilayer board 2, the chip components 3 are mounted. According to the printing resin sealing method, a metal mask 16 having an aperture in a desired shape is aligned with respect to the ceramic multilayer board 2 with a certain gap kept between them, and the liquid epoxy resin 6 is applied thereon using a squeegee 17.

FIG. 10 shows an example where the ceramic multilayer board 2 with components mounted thereon is sealed by a transfer molding method. The ceramic multilayer board 2 with the chip components 3 mounted thereon is placed between an upper mold 91 and a lower mold 92 of a resin sealing mold and a peripheral portion of the board 2 is pinched between the molds to control the position of the board 2. Subsequently, an epoxy resin is filled into a cavity 10 provided in the upper mold 91. This method has the advantages that a dimensional variation is small by virtue of using a mold, the number of generated voids is small because sealing is conducted under the application of pressure to the resin, and therefore the gap between the chip component 3 and the ceramic multilayer board 2 is more likely to be filled. In addition, this method has superior mass-production capability. Such a conventional example is suggested by JP 10(1998)-92979 A. That is to say, as a result of molding with the resin sealing mold shown in FIG. 10, a molded product shown in FIGS. 11A and 11B is obtained. Note here that FIG. 11A is a plan view of the conventional molded product, and FIG. 11B is a cross-sectional view of the same. An epoxy resin 6 is molded on the ceramic multilayer board 2 with a step height.

However, when the transfer molding is conducted with the ceramic multilayer board, the board is warped three-dimensionally due to a distortion resulted from baking at high temperatures and the warp is generated irregularly, and in this method in which a peripheral portion of the board is pinched between the upper and lower molds having flat surfaces, a crack might be generated at the peripheral portion of the board, and in some cases the crack might reach a central portion of the board. For these reasons, molding of the sealing resin is difficult. In addition, when dice-cutting the thus obtained molded product, a problem of becoming vulnerable to a crack occur due to the step height.

SUMMARY OF THE INVENTION

In order to cope with the above-stated problems in the prior art, it is an object of the present invention to provide a semiconductor device and a method for manufacturing the same, by which a ceramic multilayer board with a semiconductor element and chip components as a peripheral circuit mounted thereon is sealed with a resin by a transfer molding method so as not to generate a crack in the board.

To fulfill the above object, the semiconductor device according to the present invention is a one side molded type semiconductor device, which includes a ceramic multilayer board having a surface and a rear face. On the surface an active component and a passive component are mounted and the surface is sealed with a resin, and on the rear face electrodes for connecting to the outside are exposed. Here, the sealing resin extends beyond an edge of the board so as to be flush with respect to the rear face of the board, surround a periphery of the board and form a cross-section in a rectangular shape, and a resin film is attached to the rear face of the board.

Next, the method for manufacturing a semiconductor device according to the present invention is a method for manufacturing a one side molded type semiconductor device that includes a ceramic multilayer board having a surface and a rear face, on the surface an active component and a passive component being mounted and the surface being sealed with a resin, and on the rear face electrodes for connecting to outside being exposed. The method includes the steps of: attaching the rear face of the board to a resin film with an adhesive layer; mounting the board into a mold having a cavity with the resin film side down; and closing the mold and filling a sealing resin into the cavity, so that the surface of the board with the elements mounted thereon is sealed with the sealing resin and the sealing resin is molded so as to extend beyond an edge of the board to be flush with respect to the rear face of the board, surround a periphery of the board and form a cross section in a rectangular shape.

DETAILED DESCRIPTION OF THE INVENTION

Figure 1:
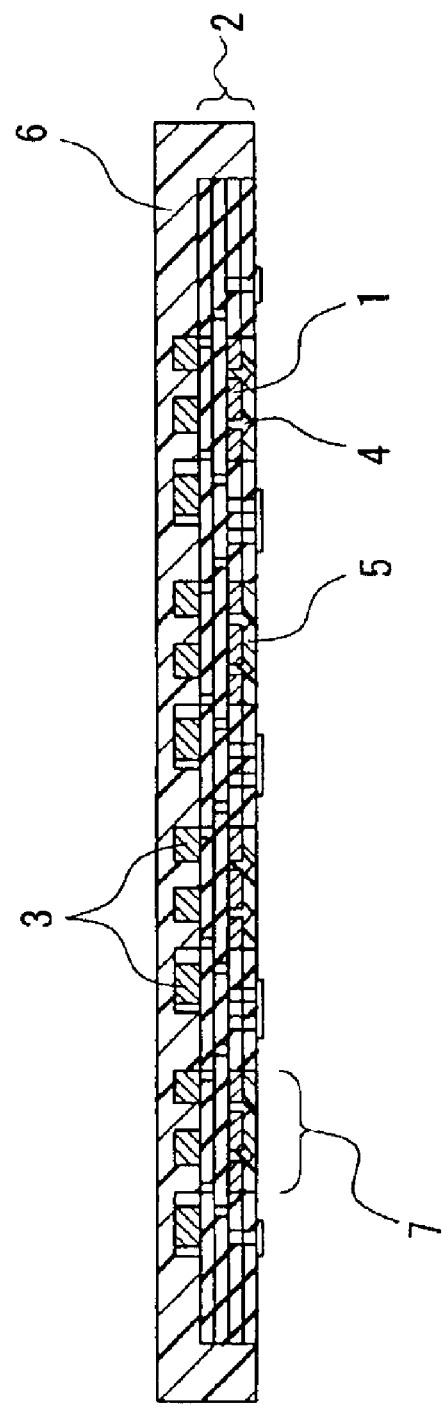
FIG. 1 is a cross-sectional view showing a semiconductor device in accordance with Working Example 1 of the present invention.

According to the present invention, an epoxy resin is formed so as to be flush with respect to the rear face of the board and surround the periphery of the board. Therefore, the mechanical strength of the ceramic board against, for example, an external shock can be increased, and therefore the board becomes more durable. As a result, cracks in the board generated during the manufacturing process can be decreased, and the yield can be improved. In addition, with the increase in the mechanical strength, the casing for carrying the board can be simplified, and therefore the cost required for transportation can be lowered. Further, when the board sealed with resin is divided into a chip by dicing, a dicing blade begins cutting from the epoxy resin formed surrounding the periphery of the board, and therefore the frequency of a breakage of the blade can be lowered considerably as compared with the case of beginning cutting from the ceramic board.

According to the manufacturing method of the present invention, the position of a ceramic board with a semiconductor element and chip components mounted thereon is controlled by attaching it to a resin film with adhesive. Therefore, when sealing with resin by transfer molding, there is no need for controlling the position of the board by pinching it between molds, which can prevent the board from cracking. In addition, the resin film and not the board is put between the molds, so a clamping pressure applied by the upper and lower molds can be increased, which allows a pressure for filling an epoxy resin into a cavity to be increased. As a result, a portion into which the resin is not filled can be eliminated, the number of voids can be decreased, and a state of filling a gap between the chip component and the board can be improved. Thus the molding process as a whole can be improved. Furthermore, by virtue of the resin sealing method using molds, variations in the thickness of resin is small all over the surface of the ceramic multilayer board, as compared with the printing method, and moreover it is easy to increase the productivity several times versus the printing method during the same molding cycle time by increasing the number of masks included in the mold used for sealing. Therefore, this method has a superior productivity as well.

In the present invention, it is preferable that the width of the resin for sealing, which is formed so as to surround the periphery of the board, is in a range of 1 mm to 10 mm, inclusive. If the width is less than 1 mm, then the effects of reinforcement for the periphery may be insufficient, whereas if the width exceeds 10 mm, then the effect of reinforcement does not change very much, but the cost required for the resin would be increased. More preferable width is in a range of 2 mm to 6 mm, inclusive.

It is preferable that the thickness of the resin for sealing, which is formed so as to surround the periphery of the board, is in a range of 0.8 mm to 4 mm, inclusive. If the thickness is less than 0.8 mm, then the effects of reinforcement for the periphery may be insufficient, whereas if the thickness exceeds 4 mm, then the effect of reinforcement does not change very much, but the cost required for the resin would be increased. More preferable thickness is in a range of 1 mm to 2 mm, inclusive.

In addition, it is preferable that the surface of the sealing resin is formed to be flat. This is because the flat surface is convenient for handling and mounting the semiconductor device when using it for various applications.

An active component mentioned in the present invention may include a semiconductor element, and a passive component may include a resistor, a capacitor, or an inductor.

In the present invention, it is preferable that the sealing resin is an epoxy resin. As the epoxy resin, any well-known resin for sealing semiconductor elements, including cresol novolac type, biphenyl type, phenol novolac type, phenol novolac/aralkyl phenol novolac type, dicyclo type, glycidyl ether type, glycidyl ester type, glycidyl amine type, alicyclic type, etc., may be used. Particularly, a reflow-resistance type epoxy resin is preferable. Among the aforementioned epoxy resins, the cresol novolac type epoxy resin includes "YDCN-500" (trademark by Tohto Kasei Co., Ltd), "SUMI-EPOXY ESCN-195" series (trademark by Sumitomo Chemical Co., Ltd), and "EOCN" series (trademark by NIPPON KAYAKU Co., Ltd). The biphenyl type epoxy resin includes "CEL-9200" (trademark by Hitachi Chemical Co., Ltd) and "Epikote YX" series and "Epikote YL" series (trademark by Yuka Shell Epoxy K.K.). The dicyclo type epoxy resin includes "EPICLON HP-7200" and "EPICLON N-665" (trademark by DAINIPPON INK AND CHEMICALS, INC) and "Panasealer CV8400" (trademark by Matsushita Electric Works, Ltd). Other polyfunctional epoxy resins include "EPPN-501H, EPPN-501HY, FAE-2500, NC-7000L, XD-10002L" (trademark by NIPPON KAYAKU Co., Ltd), "YDCN-1312" (trademark by Tohto Kasei Co., Ltd), and "SUMI-EPOXY ESLV-201" (trademark by Sumitomo Chemical Co., Ltd).

In the present invention, it is preferable that the ceramic multilayer board is attached to a metal frame member with the resin film with a predetermined gap between them, and a protrusion portion is formed continuously in an upper mold of the resin sealing mold so as to surround the cavity, whereby when the metal frame member is fixed to a lower mold and the upper mold and the lower mold are clamped, then the protrusion portion of the upper mold enters between the metal frame member and the ceramic multilayer board so as to press against the film. With this configuration, during a resin sealing process, the protrusion portion of the upper mold enters into a gap between the metal frame member and the ceramic multilayer board so as to surround the ceramic multilayer board and press against the resin film. Therefore, resin sealing can be performed without pressing against the ceramic multilayer board. Since the ceramic multilayer board is not pressed, cracking in the board can be decreased. Further, a resin filling pressure can be increased, which results in improvement in the quality concerning molding.

Additionally, since the metal frame member and the ceramic multilayer board are integrated with each other via the resin sheet, these elements can be mounted and demounted easily with respect to the sealing mold.

For the resin film, any film can be used as long as it is capable of resisting temperatures given during the transfer molding process (e.g., 170° C.). For example, a film made of polyethylene terephthalate (PET), polyethylene-2, 6-naphthalate (PEN), polyimide (PI), polytetrafluoroethylene (PTFE), polyvinyl fluoride (PVDF), tetrafluoroethylene-hexafluoropropylene copolymer (PFEP), polychlorotrifluoroethylene (PCTFE), tetrafluoroethylene-perfluoroalkyl vinylether copolymer (PFA), tetrafluoroethylene-ethylene copolymer (PETFE), and polyphenylene sulfide (PFS) can be used. It is preferable that the thickness of the resin film is not less than 5 $\mu$m.

For the metal frame member, for example, a rectangular member of 300 mm in length and 250 mm in breadth, made of stainless steel and having a thickness of 1 mm to 2 mm, inclusive, and a width of 10 mm to 30 mm, inclusive can be used. In this case, four array boards can be arranged within the metal frame member. On one array board, sixteen semiconductor devices in total are arranged with four rows and four columns.

Preferably, resin sealing is preformed in a state where a sheet having rubber elasticity is provided under the resin film attached to the metal frame member, on which the ceramic multilayer board is placed. With this configuration, even when the amount of warp in the ceramic multilayer board due to a distortion generated during baking is extremely large, the sheet having rubber elasticity, such as a silicone rubber, provided under the bottom face of the board, absorbs and disperses a stress, whereby a crack in the board can be prevented. It is preferable that the sheet having rubber elasticity is made of silicone rubber, because the material has high heat resistance.

In addition, it is preferable to form a concave structure whose bottom surface is flat, at a portion where the rubber sheet is provided in the lower mold. With this configuration, the position of the rubber sheet can be controlled so as not to slide over the mold. In addition, even when the thickness of the rubber sheet should be changed with the degree of the warp in the board, sealing can be performed so as to make the thickness of the epoxy resin flat by adjusting the step height of the concave structure and without the need for modifying the cavity.

Furthermore, it is preferable to perform sealing with resin in a state where a second resin sheet is sandwiched between the rubber sheet and the resin film attached to the metal frame member. This configuration prevents resin fins generated during sealing with resin from adhering to the rubber sheet directly. Since the rubber sheet has microscopic asperities on the surface, dust tends to be adhered to the surface, and once the dust adheres to the rubber sheet, it cannot be removed using a means such as an air blower. If resin sealing is performed in a state where the dust adheres to the rubber sheet, then a pressure is applied to them while a substance having a different hardness is put between the ceramic multilayer board and the rubber sheet, which might become another cause of a crack in the board. On the other hand, if the resin sheet is provided on the rubber sheet, since the surface of the resin sheet is smooth, the dust can be removed using an air blower or the like. As a result, the possibility of a crack in the board generated due to the dust put into the device can be eliminated.

WORKING EXAMPLE 1

The following describes Working Example 1 of the present invention, with reference to FIG. 1. FIG. 1 shows a cross-sectional view of a semiconductor device schematically. This semiconductor device was produced by mounting a semiconductor element and chip components 3 including a resistor, capacitor, and a inductor, which make up the peripheral circuit of the semiconductor element, on a multilayer board made of alumina ceramic, and sealing with resin one side of the ceramic board so as to be flat by the transfer molding method.

On the rear face of the alumina ceramic multilayer board 2, a cavity for mounting the semiconductor element 1 and electrodes for connecting to the outside of the board were arranged, whereas on the surface of the board, a wiring pattern of chip components, which made up the peripheral circuit, was formed, and these wiring pattern, the cavity, and the electrode were arranged repeatedly lengthwise and breadthwise so that a matrix board was formed as a whole.

The outer dimensions of the alumina ceramic multilayer board 2 were 70 mm in length, 70 mm in breadth, and 0.7 mm in thickness. On such a board, chips of 15 mm square were arranged with four rows and four columns. For each chip of 15 mm square, a cavity and an electrode for connection to the outside were formed on the rear face, and a wiring pattern for the chip components was formed on the surface.

The semiconductor element 1 was dice-bonded into the cavity 7, was connected by a metal wire 4 to the wiring pattern formed in the cavity 7 beforehand, and was sealed with an epoxy potting resin 5. On the surface of the board, the chip components 3 including a resistor, a capacitor, and the like were mounted.

The thus prepared board was sealed with an epoxy resin (biphenyl type epoxy resin, CEL-9200 (trademark by Hitachi Chemical Co., Ltd)) 6 so that the surface of the resin on the side on which components were mounted became flat, the surface of the resin on the side on which electrodes were formed became flush with respect to the electrode surface and the resin surrounded the periphery of the board.

Figure 8A:
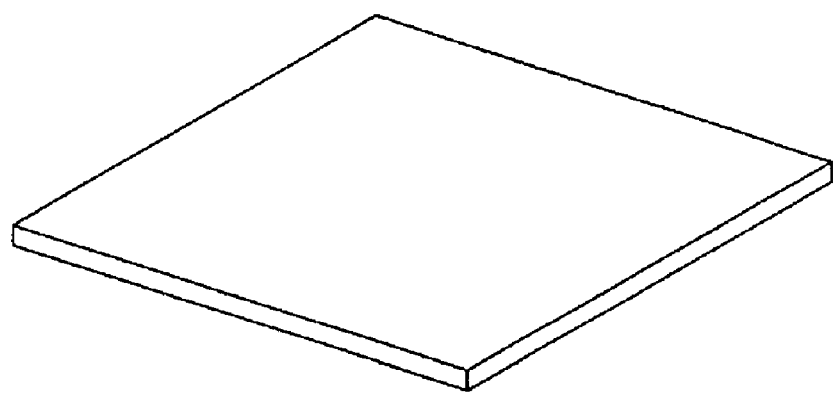
FIG. 8A is a perspective view of a surface of the semiconductor device in Working Example 1, 3, and 4 of the present invention.
Figure 8B:
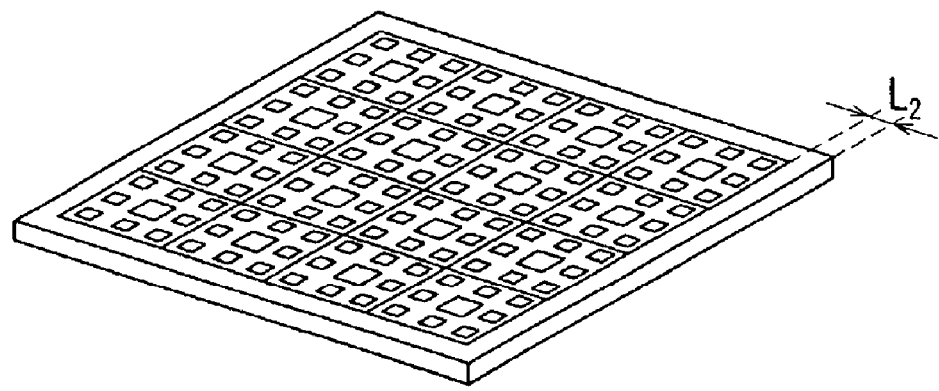
FIG. 8B is a perspective view of a rear face of the same.
Figure 9:
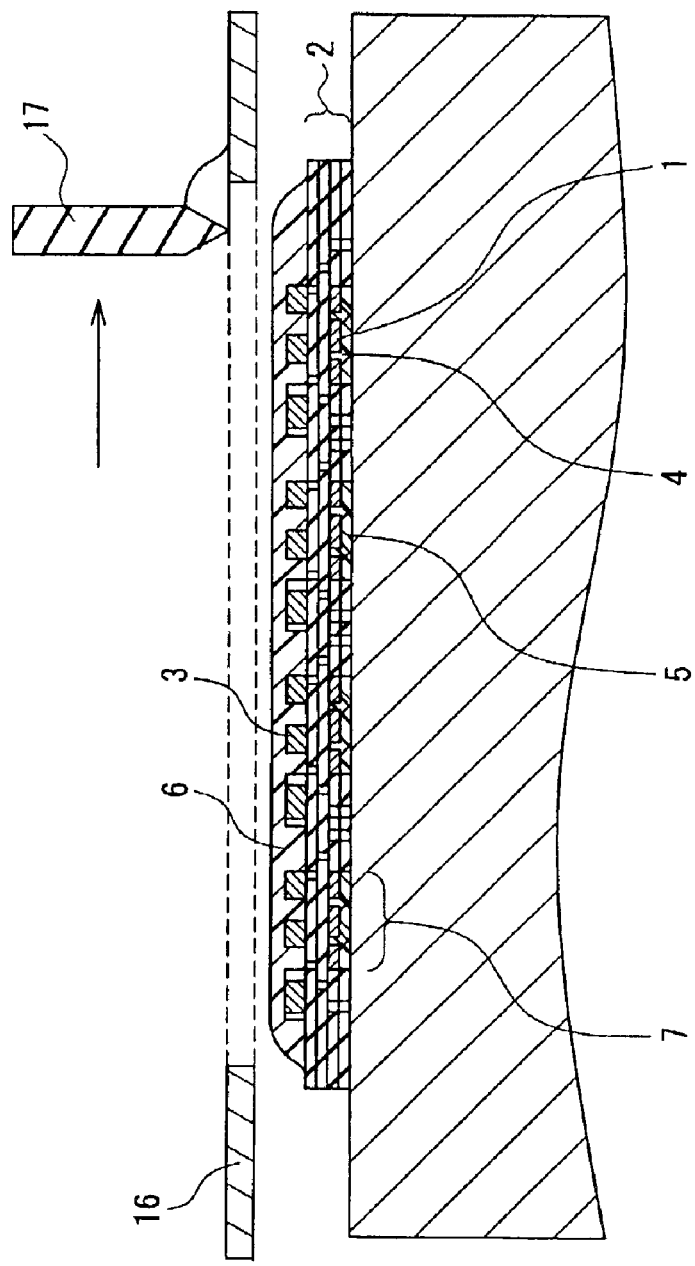
FIG. 9 is a cross-sectional view showing a method for manufacturing a semiconductor device according to the prior art.
Figure 10:
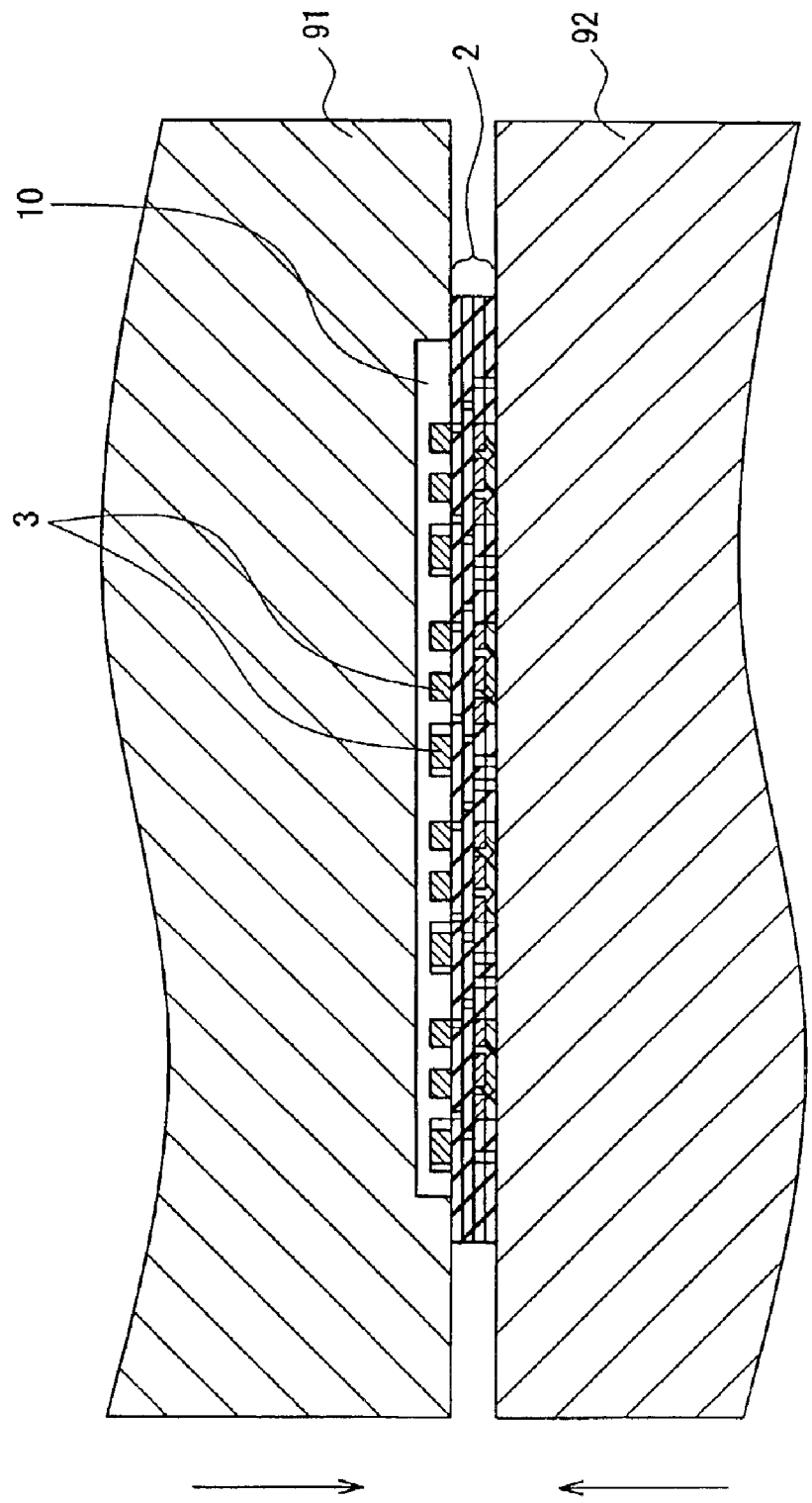
FIG. 10 is a cross-sectional view showing another method for manufacturing a semiconductor device according to the prior art.
Figure 11A:
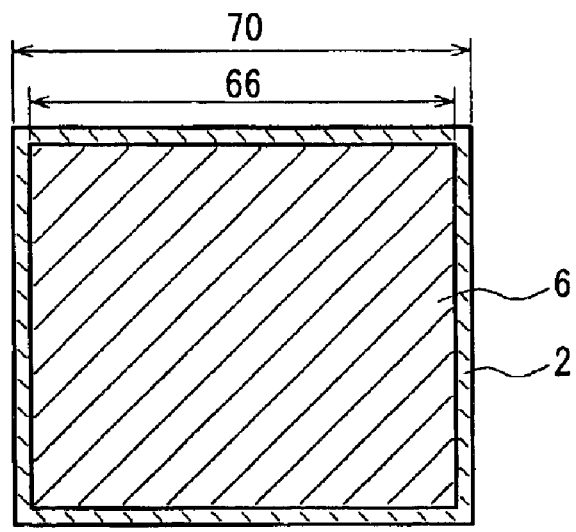
FIG. 11A is a plan view showing a conventional molded product with a step height structure.
Figure 11B:
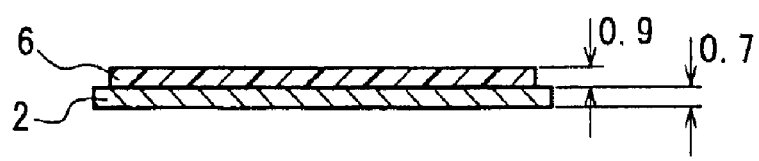
FIG. 11B is a cross-sectional view of the same.

The outer dimensions after sealing with resin were 74 mm in length, 74 mm in breadth, and 1.6 mm in thickness, and the periphery of the board as a whole was surrounded with the resin having a width ($L_2$) of 2 mm. FIGS. 8A and 8B are perspective views showing the surface and the rear face of the board, respectively.

Since the epoxy resin 6 had a shape like a loop so as to surround the periphery of the board, the mechanical strength of the board against, for example, an external shock could be increased as compared with the shape where the periphery is exposed, and therefore the board became more durable. Handling of the board during the assembly process also became easy, and the problem of breaking the board by dropping carelessly could be decreased. Furthermore, when carrying the board after sealing with resin, the casing for carrying the board could be simplified, and therefore the cost required for transportation could be lowered.

The alumina ceramic multilayer board 2 was provided with sixteen chips arranged with four rows and four columns in one board. Normally, these chips were divided by dicing. When dicing the board sealed with resin, a dicing blade begins cutting the board from the epoxy resin formed around the board. As a result, by virtue of shock absorption capability, the frequency of a breakage of the blade could be lowered considerably as compared with the case of beginning cutting from the ceramic board.

WORKING EXAMPLE 2

Figure 2:
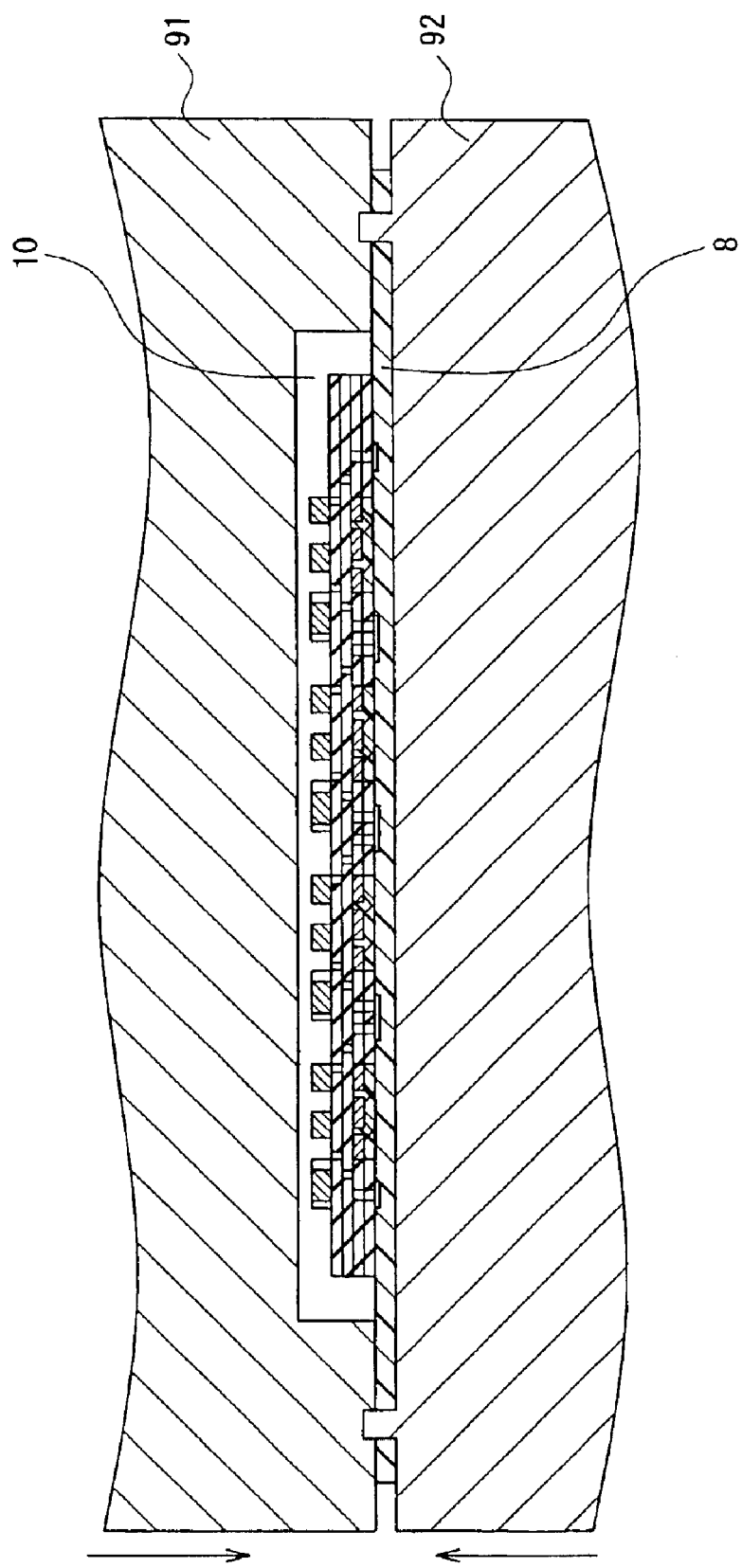
FIG. 2 is a cross-sectional view showing a method for manufacturing a semiconductor device in accordance with Working Example 2 of the present invention.

The following describes Working Example 2 of the present invention, with reference to FIG. 2. FIG. 2 is a schematic diagram showing a step for sealing a semiconductor device with resin. In this figure, numeral 8 denotes a resin film with adhesive and numeral 10 denotes a cavity provided in an upper mold. This semiconductor device was produced by mounting a semiconductor element and chip components that make up the peripheral circuit of the semiconductor element on a ceramic multilayer board, and sealing with resin one side of the ceramic board so as to be flat by the transfer molding method in the same manner as in Working Example 1. Explanations of the board and components are the same as in Working Example 1.

As for a mold used for resin sealing, a cavity was made in the upper mold for filling a resin, the lower mold had four metal pins for controlling the position of a resin sheet, and the remaining portions were flat. The size of the cavity was 74 mm in length, 74 mm in breadth, and 0.9 mm in depth.

According to this example, first, the resin film with adhesive 8 was attached to a predetermined portion on the face of the board on which resin sealing would not be conducted, i.e., on the rear face of the board, so that the board was controlled positionally so as not to move. The resin film with adhesive 8 used was, as one example, a base PET (polyethylene terephthalate) with adhesive applied thereon, and the size was 150 mm square and 40 µm in thickness. At four corners of the resin film, holes used for position control within the mold were provided. The same effects can be obtained using a polyimide sheet with adhesive as the resin film. In order not to pinch the board between the molds when clamping the upper and lower molds 91 and 92, the board should be located inside of the cavity 10 provided in the upper mold 91. In addition, when attaching the resin film 8 to the board, a tension was given to the resin film 8 to press air out so as not to leave the air between the rear face of the board and the resin film 8.

Next, it is preferable that the metal pins provided in the lower mold 92 are passed through the four holes provided at the four corners of the resin film 8 so as to control the position of the resin film. When passing the metal pins through the holes of the resin film, this process was performed while stretching the film to keep it from becoming wrinkled.

After that, the molds for sealing were clamped, and sealing was conducted using an epoxy resin (biphenyl type epoxy resin, CEL-9200 (trademark by Hitachi Chemical Co., Ltd)) 6 by the transfer molding method. With this method, the board was not pinched between the molds, so that the clamping pressure could be increased, for example, to 30 tons. The setting temperature of the mold was 170° C. and the resin filling pressure was 7 MPa.

According to this example, since position control was conducted by pinching the resin film and not the board, the generation of a crack in the board could be prevented. In addition, as the clamping pressure could be increased, the resin filling pressure also could be increased, which could eliminate a portion into which resin was not filled, could decrease the number of voids, and could improve a state of filling a gap between the chip component and the board, which is difficult for the printing sealing method. Thus, the yield as to the molding process as a whole and the quality could be improved.

Figure 7A:
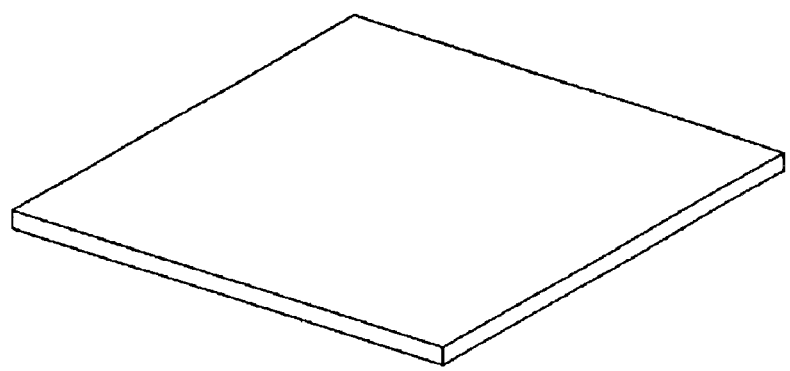
FIG. 7A is a perspective view of a surface of the semiconductor device in Working Example 2 of the present invention.
Figure 7B:
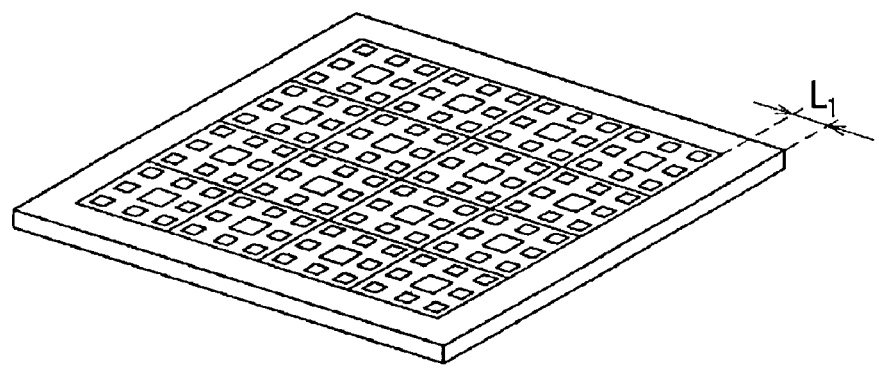
FIG. 7B is a perspective view of a rear face of the same.
Figure 12A:
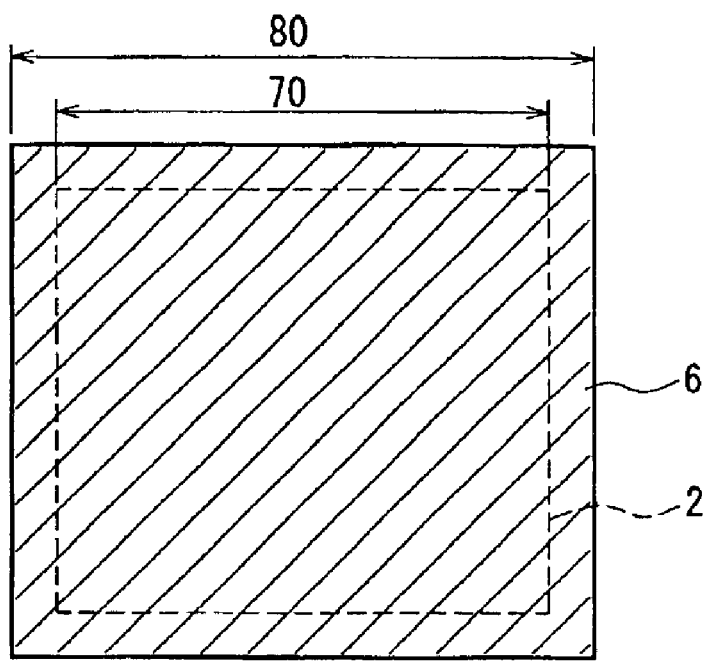
FIG. 12A is a plan view showing a molded product having a cross section in a rectangular shape according to Working Example 2 of the present invention.
Figure 12B:
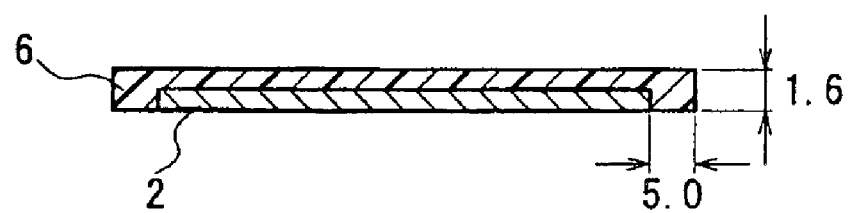
FIG. 12B is a cross-sectional view of the same.

The outer dimensions of the board after sealing with resin were 80 mm in length, 80 mm in breadth, and 1.6 mm in thickness, and the periphery of the board as a whole was surrounded with the resin having a width ($L_1$) of 5 mm. FIGS. 7A and 7B are perspective views showing the surface and the rear face of the thus obtained molded product, respectively. Also, FIG. 12A is a plan view of the molded product and FIG. 12 B is a cross-sectional view of the same. The epoxy resin 6 surrounded the ceramic multilayer board 2 completely, and a cross section of the epoxy resin 6 was formed in a rectangular shape.

In the case of making the cavity 10 trapezoidal so as to facilitate taking a product from the mold after the resin sealing process, the following problem occurs: that is, during a dicing process where the alumina ceramic board is turned upside, stress might be applied to the acute corner portion when handling the product. As a result, inner cracks, which are difficult to be found, might occur.

However, in the case where the cross section of the epoxy resin at the sides of the ceramic board is a rectangular as in these Working Examples 1 and 2, any stress is not applied during handling, and therefore cracks can be avoided. Furthermore, the amount of resin sealing material used can be reduced compared with a trapezoidal shape.

WORKING EXAMPLE 3

Figure 3:
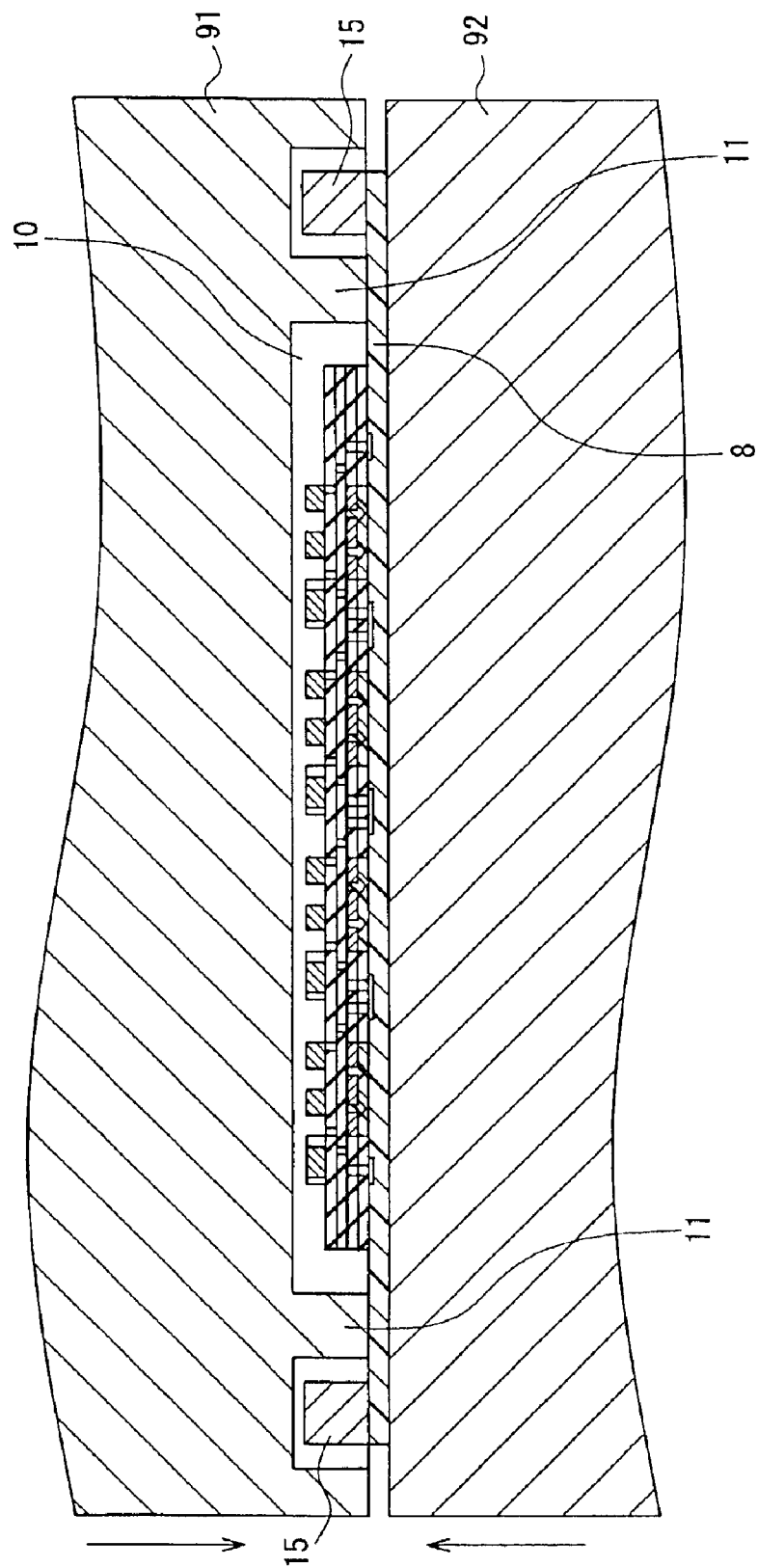
FIG. 3 is a cross-sectional view showing a method for manufacturing a semiconductor device in accordance with Working Example 3 of the present invention.

The following describes Working Example 3 of the present invention, with reference to FIG. 3. FIG. 3 is a schematic diagram showing a step for sealing a semiconductor device with resin. In this figure, numeral 8 denotes a resin film with adhesive, numeral 10 denotes a cavity provided in an upper mold, numeral 11 denotes a protrusion portion provided in the upper mold, and numeral 15 denotes a metal frame member. This semiconductor device was produced by mounting a semiconductor element and chip components as a peripheral circuit of the semiconductor element on a ceramic multilayer board, and sealing with resin one side of the ceramic board so as to be flat by the transfer molding method in the same manner as in Working Example 1. Explanations of the board and components are the same as in Working Example 1. The configuration of the mold for sealing with resin also is the same as in Working Example 2.

According to this example, first, the board and the metal frame member were positioned with a predetermined gap therebetween, and both of these elements were attached to the resin film with adhesive 8. The metal frame member was made of stainless steel, whose size was 150 mm square, and an aperture so as to contain the board was provided at the center portion of the frame member. The width and the thickness of the metal frame member were 30 mm and 1 mm, respectively, and the size of the aperture provided at the center portion was 90 mm square. The resin film is the same as in Working Example 1. The attachment to the resin film was conducted with a jig, and this process was conducted while giving a tension to the resin film so as to keep it from becoming wrinkled.

Next, after the metal frame member 15 onto which the board has been attached was fixed to a lower mold, the upper and lower molds 91 and 92 were clamped.

In the cavity of the upper mold, the protrusion portion 11 was formed, having a configuration of, when clamping the molds, entering into the gap between the metal frame member and the ceramic multilayer board to surround the board. When clamping, the protrusion portion 11 pressed against the rein film so as to control the position of the board. After that, an epoxy resin (biphenyl type epoxy resin, CEL-9200 (trademark by Hitachi Chemical Co., Ltd)) was filled into the cavity 10 so as to seal the board with the epoxy resin. The molding conditions, such as the clamping pressure, the temperature of the molds, and the resin filling pressure, were the same as in Working Example 2.

When sealing with resin, the protrusion portion provided in the upper mold pressed against the resin film directly so as to control the position of the board, which could eliminate a crack in the board when sealing with resin. One of the features of Working Example 3 is in that the metal frame member 15 and the ceramic multilayer board are integrated with each other via the resin sheet 8, which facilitates mounting and demounting these elements with respect to the sealing mold. This method allows a plurality of boards to be sealed with resin at one time, which could improve the productivity considerably. Furthermore, since the outer dimensions of the formed resin were slightly larger than the size of the ceramic multilayer board, the outer dimensions of the resin could be made smaller than in Working Example 2, and the amount of consumed resin could be decreased. Moreover, the resin filling pressure also could be increased. In addition, a portion into which resin was not filled could be eliminated, the number of voids could be decreased, and a state of filling a gap between the chip component and the board could be improved, which is difficult for the printing sealing method. Thus, the yield as to the molding process as a whole and the quality could be improved.

Figure 13A:
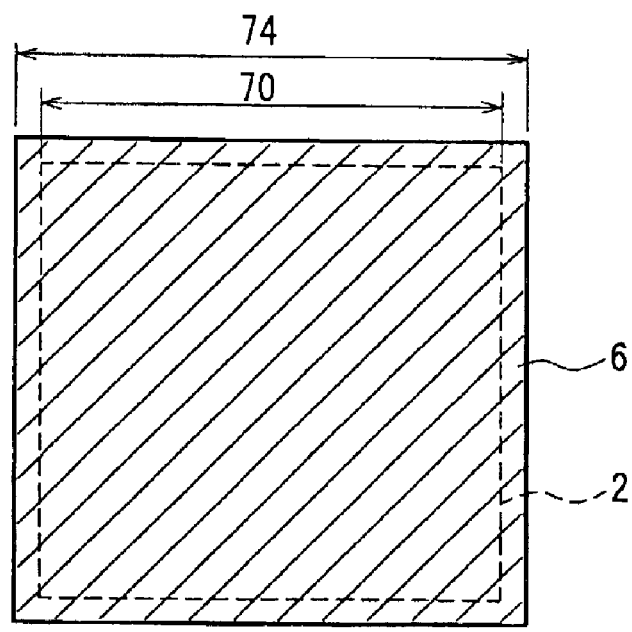
FIG. 13A is a plan view showing a molded product having a cross section in a rectangular shape according to Working Examples 3 to 4 of the present invention.
Figure 13B:
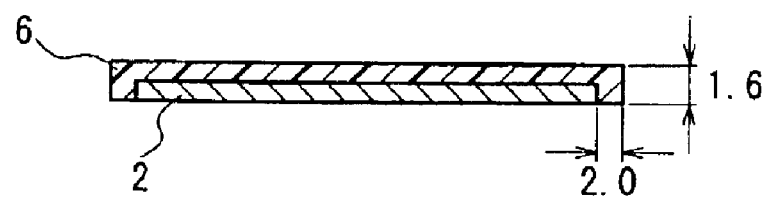
FIG. 13B is a cross-sectional view of the same.

The outer dimensions of the board after sealing with resin were 74 mm in length, 74 mm in breadth, and 1.6 mm in thickness, and the periphery of the board as a whole was surrounded with the resin having a width ($L_2$) of 2 mm. FIGS. 8A and 8B are perspective views showing the surface and the rear face of the thus obtained molded product, respectively. Also, FIGS. 13A and 13B are a plan view and a cross-sectional view of the same, respectively. The epoxy resin 6 surrounded the ceramic multilayer board 2 completely, and a cross section of the epoxy resin 6 was formed in a rectangular shape. With this configuration, when dice-cutting the product, generation of cracks was not found.

WORKING EXAMPLE 4

Figure 4:
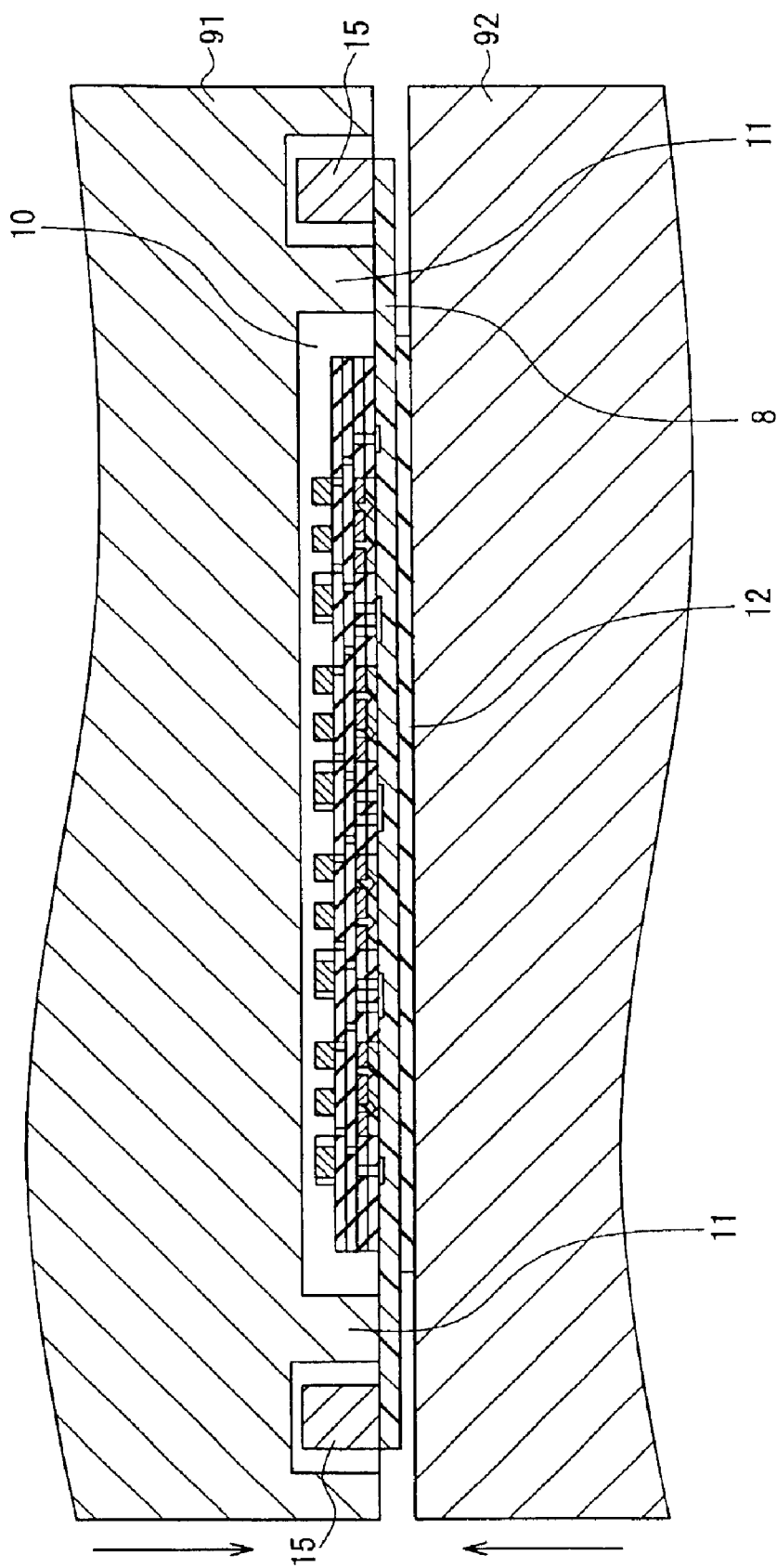
FIG. 4 is a cross-sectional view showing a method for manufacturing a semiconductor device in accordance with Working Example 4 of the present invention.

The following describes Working Example 4 of the present invention, with reference to FIG. 4. FIG. 4 is a schematic diagram showing a step for sealing a semiconductor device with resin. In this figure, numeral 8 denotes a resin film with adhesive, numeral 10 denotes a cavity provided in an upper mold, numeral 11 denotes a protrusion portion provided in the upper mold, numeral 12 denotes a rubber sheet, and numeral 15 denotes a metal frame member. This semiconductor device was produced by mounting a semiconductor element and chip components as a peripheral circuit of the semiconductor element on a ceramic multilayer board, and sealing with resin one side of the ceramic board so as to be flat by the transfer molding method in the same manner as in Working Example 1. Explanations of the board and components are the same as in Working Example 1. The configuration of the mold for sealing with resin also is the same as in Working Example 2.

According to this example, first, the board and the metal frame member 15 were positioned with a predetermined gap therebetween, and both of these elements were attached to the resin film with adhesive 8. The metal frame member 15 and the resin film 8 are the same as in Working Example 3. The attachment to the resin film was conducted with a jig, and this process was conducted while giving a tension to the resin film so as to keep it from becoming wrinkled.

Next, the sheet 12 having elasticity of rubber such as a silicone resin, whose size was the same as the board, or was a size larger than the board, was provided at a portion on a lower mold for sealing, where the board would be fixed, and the metal frame member to which the board has been attached was fixed on the sheet 12. The rubber sheet 12 needs to have a property of resisting high temperatures of the mold and high pressures for filling a resin, and therefore the sheet made of silicone rubber was employed. The size of the silicone rubber sheet was 75 mm square and 0.5 mm in thickness.

Note here that in Working Examples 2 and 3 sealing with epoxy resin could be performed without generation of a crack in the board. However, if a warp in the board due to a distortion generated during baking exceeds 0.5 mm in size, or if a sudden change in a warp occurs locally such as in the case where an edge portion is crimpled, by providing the rubber sheet 12 under the lower face of the board as in Working Example 4, the rubber sheet could provide the effect of absorbing, dispersing, and reducing a pressure applied to the board when filling a resin, and thus sealing could be performed without generation of a crack in the board.

The outer dimensions of the board after sealing with resin were 74 mm in length, 74 mm in breadth, and 1.6 mm in thickness, and the periphery of the board as a whole was surrounded with the resin having a width ($L_2$) of 2 mm. FIGS. 8A and 8B are perspective views showing the surface and the rear face of the board, respectively. Also, FIGS. 13A and 13B are a plan view and a cross-sectional view of the same, respectively. The epoxy resin 6 surrounded the ceramic multilayer board 2 completely, and a cross section of the epoxy resin 6 was formed in a rectangular shape. With this configuration, when dice-cutting the product, generation of cracks was not found.

WORKING EXAMPLE 5

Figure 5:
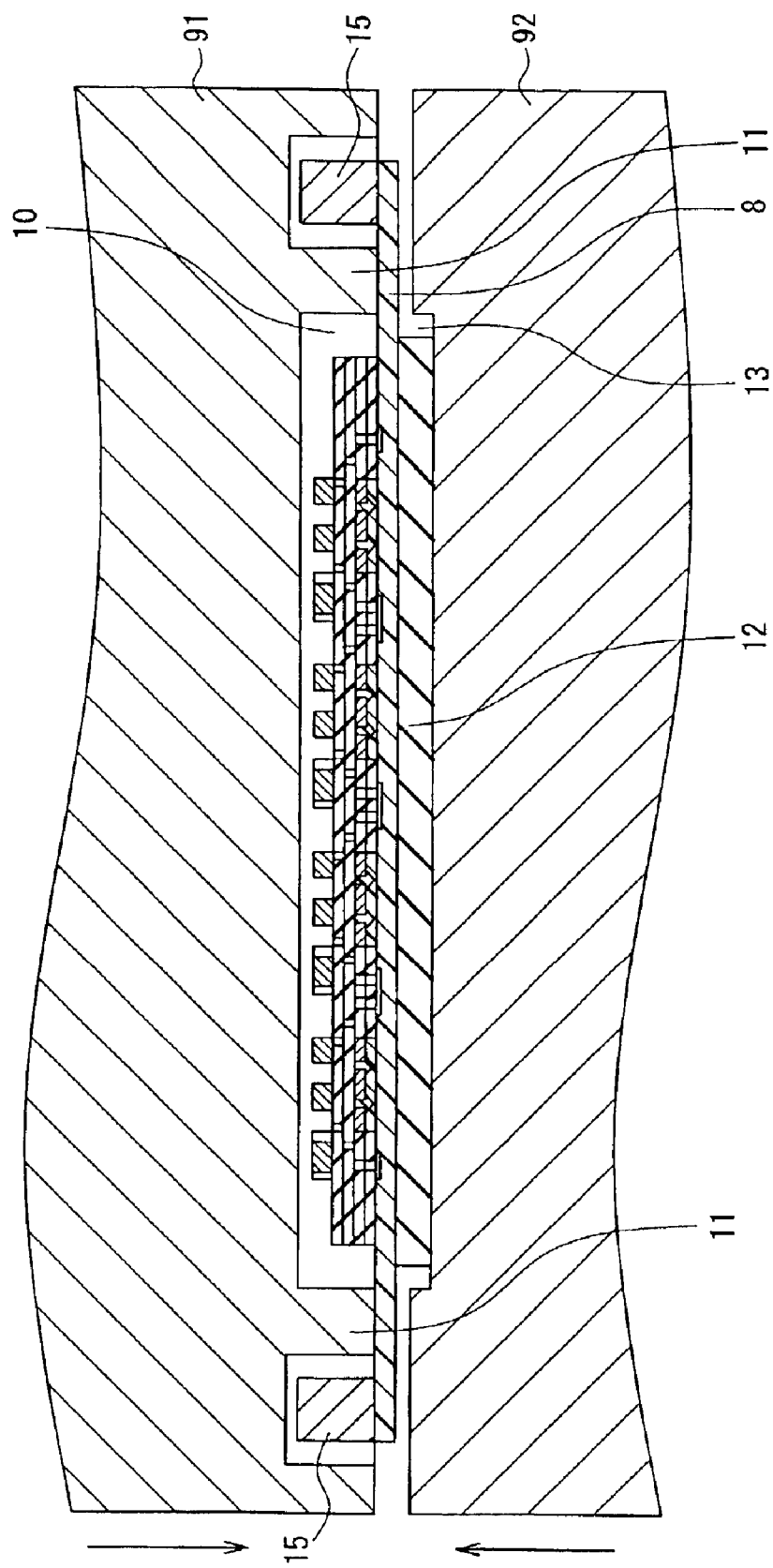
FIG. 5 is a cross-sectional view showing a method for manufacturing a semiconductor device in accordance with Working Example 5 of the present invention.

The following describes Working Example 5 of the present invention, with reference to FIG. 5. FIG. 5 is a schematic diagram showing a step for sealing a semiconductor device with resin. In this figure, numeral 11 denotes a protrusion portion provided in the upper mold, numeral 12 denotes a rubber sheet, numeral 13 denotes a concave portion provided in the lower mold, and numeral 15 denotes a metal frame member. This semiconductor device is a modification of the above Working Example 4, in which a step height is provided by making a hollow in the lower mold for sealing, at the position where the rubber sheet 12 will be placed, and the bottom of the hollow is made flat so as to contain the rubber sheet 12. The size of the hollow was made a size larger than the rubber sheet and the depth of the hollow was half of the thickness of the rubber sheet. That is, the size of the rubber sheet was 75 mm square and 0.5 mm in thickness, and the size of the hollow was 77 mm square and 0.25 mm in depth. With this configuration, the rubber sheet could be controlled positionally so as not to slide over the mold. In addition, even when the thickness of the rubber sheet should be changed with the degree of the warp in the board, sealing could be performed so as to make the thickness of the epoxy resin flat by adjusting the step height and without need for modifying the cavity in the upper mold.

WORKING EXAMPLE 6

Figure 6:
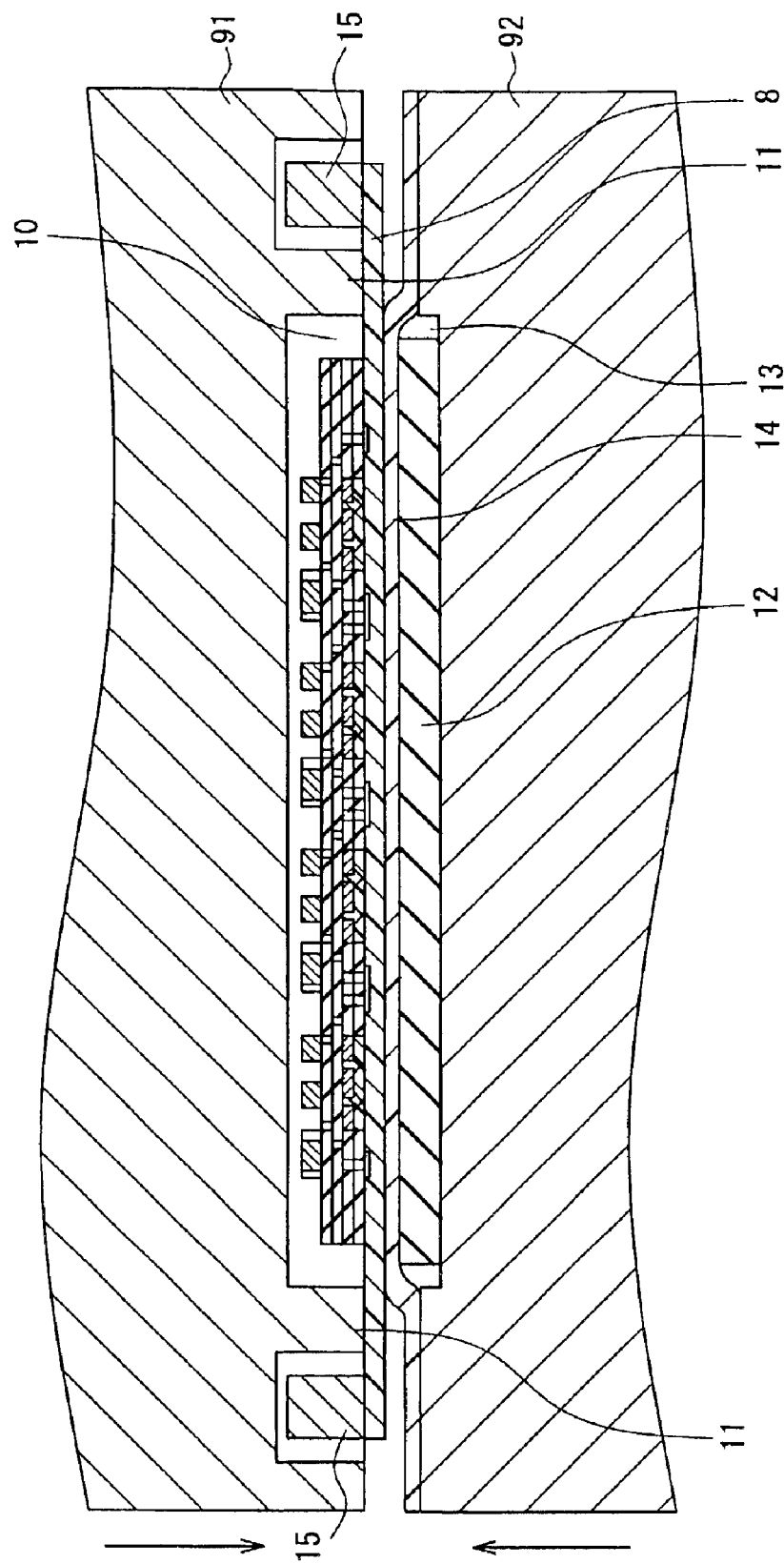
FIG. 6 is a cross-sectional view showing a method for manufacturing a semiconductor device in accordance with Working Example 6 of the present invention.

The following describes Working Example 6 of the present invention, with reference to FIG. 6. FIG. 6 is a schematic diagram showing a step for sealing a semiconductor device with resin. In this figure, numeral 8 denotes a resin film with adhesive, numeral 10 denotes a cavity provided in the upper mold, numeral 11 denotes a protrusion portion provided in the upper mold, numeral 12 denotes a rubber sheet, numeral 13 denotes a concave portion provided in the lower mold, numeral 14 denotes a second resin film, and numeral 15 denotes a metal frame member. This semiconductor device is a modification of the above Working Example 5, in which resin sealing is performed while sandwiching the second resin film 14 between the rubber sheet 12 provided on the lower mold for sealing and the resin film 8 attached to the metal frame member 15. The second resin film was made of PET (polyethylene terephthalate) whose surface did not have tackiness, and the size was 150 mm square and 25 μm in thickness.

The PET film was fixed by pinching it between two metal frame members and was mounted over the rubber sheet provided on the lower mold. The metal frame member was made of stainless steel, whose size was 150 mm square, and an aperture so as to contain the rubber sheet was provided at the center portion of the frame member. The width of the metal frame member was 30 mm and the thickness of the metal frame member was 1 mm by laminating two frame members with a thickness of 0.5 mm, and the size of the aperture provided at the enter portion was 90 mm square. On the PET film, the metal frame member to which the board has been fixed with the resin film was mounted and fixed, and then the upper and lower molds 91 and 92 were clamped, followed by the sealing with an epoxy resin.

According to this manufacturing method, the PET film was provided over the rubber sheet made of a silicone resin or the like, which could prevent resin fins generated during sealing with resin from adhering to the rubber sheet directly. Since the rubber sheet has microscopic asperities on the surface, dust tends to be adhered to the surface, and once the dust adheres to the rubber sheet, it cannot be removed using a means such as an air blower. If resin sealing is performed in a state where the dust adheres to the rubber sheet, then a pressure is applied to them while a substance having a different hardness is put between the board and the rubber sheet, which might become another cause of a crack in the board. On the other hand, if the resin sheet is provided on the rubber sheet, since the surface of the resin sheet is smooth, the dust can be removed using an air blower or the like. As a result, the possibility of a crack in the board due to the dust put into the device could be eliminated.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a one side molded type semiconductor device that comprises a ceramic multilayer board having a surface and a rear face, on the surface an active component and a passive component being mounted and the surface being sealed with a resin, and on the rear face electrodes for connecting to outside being exposed, comprising the steps of:

attaching the rear face of the board to a resin film with an adhesive layer;

mounting the board into a mold having a cavity with the resin film side down; and closing the mold and filling a sealing resin into the cavity, so that the surface of the board with the elements mounted thereon is sealed with the sealing resin and the sealing resin is molded so as to extend beyond an edge of the board to be flush with respect to the rear face of the board, surround a periphery of the board and form a cross-section in a rectangular shape, wherein, during the step of attaching the board to the adhesive layer of the resin film, a metal frame member also is attached to the resin film, and a plurality of the boards are attached within the frame member with a predetermined interval therebetween.

2. The method for manufacturing a semiconductor device according to claim 1, wherein, after the step of mounting the board into the mold, the board is controlled positionally by pressing against a portion of the resin film.

3. The method for manufacturing a semiconductor device according to claim 1, wherein an upper mold of the mold is provided with a protrusion portion formed continuously so as to surround the cavity and an outside cavity for containing the frame member, and in the step of closing the upper mold and a lower mold of the mold in a state where the metal frame member is fixed to the lower mold and the protrusion portion provided in the upper mold enters between the metal frame member and the ceramic multilayer board so as to press against the resin film.

4. A method for manufacturing a one side molded type semiconductor device that comprises a ceramic multilayer board having a surface and a rear face, on the surface an active component and a passive component being mounted and the surface being sealed with a resin, and on the rear face electrodes for connecting to outside being exposed, comprising the steps of:

attaching the rear face of the board to a resin film with an adhesive layer;

mounting the board into a mold having a cavity with the resin film side down; and closing the mold and filling a sealing resin into the cavity, so that the surface of the board with the elements mounted thereon is sealed with the sealing resin and the sealing resin is molded so as to extend beyond an edge of the board to be flush with respect to the rear face of the board, surround a periphery of the board and form a cross-section in a rectangular shape, wherein the sealing with resin is performed in a state where a sheet having rubber elasticity is provided under the resin film attached to the metal frame member, on which the ceramic multilayer board is placed.

5. The method for manufacturing a semiconductor device according to claim 4, wherein the sheet having rubber elasticity is made of silicone rubber.

6. The method for manufacturing a semiconductor device according to claim 4, wherein a portion where the sheet is provided in the lower mold has a concave structure whose bottom surface is flat.

7. The method for manufacturing a semiconductor device according to claim 4, wherein a second resin sheet is arranged between the sheet and the resin film attached to the metal frame member.

8. The method for manufacturing a semiconductor device according to claim 4, wherein, after the step of mounting the board into the mold, the board is controlled positionally by pressing against a portion of the resin film.

* * * * *